United States Patent [19]

Nishizawa

[11] Patent Number: 4,619,811
[45] Date of Patent: Oct. 28, 1986

[54] APPARATUS FOR GROWING GAAS SINGLE CRYSTAL BY USING FLOATING ZONE

[75] Inventor: Jun-ichi Nishizawa, Sendai, Japan

[73] Assignee: Zaidan Hojin Handotai Kenkyu Shinkokai, Sendai, Japan

[21] Appl. No.: 777,004

[22] Filed: Sep. 17, 1985

Related U.S. Application Data

[63] Continuation of Ser. No. 525,541, Aug. 22, 1983, abandoned.

[30] Foreign Application Priority Data

Aug. 27, 1982 [JP] Japan ................. 57-149747

[51] Int. Cl.⁴ ............. C30B 13/20; C30B 13/28; C30B 35/00
[52] U.S. Cl. .................. 422/109; 422/250; 156/601; 156/620; 156/DIG. 81; 373/139; 373/148
[58] Field of Search ........ 422/109, 247, 250; 156/601, 620, DIG. 70, DIG. 81, DIG. 89, DIG. 93; 219/10.43, 10.75, 10.77; 373/139, 147, 148

[56] References Cited

U.S. PATENT DOCUMENTS

| | | | |
|---|---|---|---|
| 2,905,798 | 9/1959 | Freutel | 422/250 |
| 3,136,876 | 6/1964 | Crosthwait | 422/250 |
| 3,235,339 | 2/1966 | Brunet et al. | 156/620 |
| 3,260,573 | 7/1966 | Ziegler | 422/250 |
| 3,630,684 | 12/1971 | Keller | 422/250 |
| 3,642,443 | 2/1972 | Blum et al. | 156/DIG. 70 |
| 3,857,990 | 12/1974 | Steininger | 373/139 |
| 3,936,346 | 2/1976 | Lloyd | 156/620 |
| 4,190,486 | 2/1980 | Kyle | 156/601 |

FOREIGN PATENT DOCUMENTS

| | | | |
|---|---|---|---|
| 1519851 | 11/1970 | Fed. Rep. of Germany | 156/601 |
| 3007394 | 9/1981 | Fed. Rep. of Germany | 219/10.43 |
| 3007377 | 9/1981 | Fed. Rep. of Germany | 422/250 |
| 22883 | 7/1976 | Japan | 156/620 |

*Primary Examiner*—David L. Lacey
*Attorney, Agent, or Firm*—Cushman, Darby & Cushman

[57] ABSTRACT

An apparatus for growing a GaAs single crystal by relying on the floating zone technique in a cylinder charged with a GaAs polycrystal and a GaAs single seed crystal, comprising an As container communicating with the interior of the cylinder to supply an optimum vapor pressure of As into the cylinder under the condition that a continuous temperature variation is established between this As container and the GaAs crystals charged in the cylinder, whereby a GaAs single crystal having little deviation from stoichiometry and having a good crystal perfection is obtained.

4 Claims, 4 Drawing Figures

APPARATUS FOR GROWING GAAS SINGLE CRYSTAL BY USING FLOATING ZONE

This is a continuation of application Ser. No. 525,541, filed Aug. 22, 1983, which was abandoned upon the filing hereof.

BACKGROUND OF THE INVENTION (a) Field of the Invention

The present invention relates to an apparatus for growing, by utilizing a floating zone, a GaAs compound semiconductor single crystal which contains As having a high vapor pressure as a constituent component of the crystal.

(b) Description of the Prior Art

As is well known, a GaAs single crystal which is a compound semiconductor is used as a substrate in fabricating a device such as a field effect transistor, an SIT (static induction transistor), IC, millimeter ware diode, Tunnett diode, light-emitting diode, or a laser diode, and concurrently researchers are making a steady progress with a great expectation for the development of good GaAs single crystals to serve as a material for fabricating such semiconductor devices as transistors and semiconductor integrated circuits which are operated at high speeds, from the viewpoint that the electron mobility of a GaAs compound semiconductor is 8500 $cm^2/V \cdot sec$ which is more than five times greater than that of silicon.

As a matter of course, as the GaAs single crystal which is used as the substrate for the fabrication of such semiconductor devices as mentioned above, the crystal is desired to have an excellent crystal quality.

In the past, GaAs single crystals for use as substrates have been obtained by a single crystal growth method such as the horizontal Bridgman method or the LEC (Liquid Encapsulated Czochralski) method which uses a $B_2O_3$ layer for encapsulation of the growth zone. The former method has disadvantages such that, because it uses a quartz tube for the growth, it is difficult to obtain a single crystal of a large diameter, and that, since it is usual to grow a crystal in the (111) orientation, there are the inconveniences that (1) in order to obtain a substrate having a (100) surface which is frequently used in semiconductor devices, the crystal has to be cut not perpendicular to the (111) orientation but obliquely relative to the surface of the crystal; and (2) although it is usual to obtain a semi-insulating or highly resistive substrate by an inclusion of an impurity which is Cr or O or both, it is necessary that such an impurity or impurities must be introduced at a high temperature of 800° C. or higher, so that the inclusion of such an impurity cannot be accomplished in a stable manner. The latter method can produce a crystal of a large diameter in the (100) surface. However, since this method uses a $B_2O_3$ layer as a sealing material, the temperature gradient between the GaAs melt and the seed crystal is steep, being 100°~300° C./cm, and accordingly there is the disadvantage that the crystal which is grown easily tends to have a very large etch pits density (EPD) and develop such defects as lattice dislocation. Other than those conventional methods which have been mentioned above, there is performed Czochralski's pulling method. This known method also has similar drawbacks to those mentioned above.

There are, in fact, more important problems as will be described hereunder.

Unlike such a crystal such as silicon crystal, a GaAs compound semiconductor is a crystal which is produced by compounding two different elements. Besides, the III column element Ga has a vapor pressure which is substantially different from the vapor pressure of the V column element As. The vapor pressure of As is by far greater than that of Ga. Accordingly, the grown GaAs crystal exhibits a considerable deviation from stoichiometory. It has been usual in the growth of a GaAs crystal by conventional manners that As atoms show a shortage within the crystal so that such defects as As vacancies or lattice dislocation, or the defect representing a combination of As vacancies and impurity atoms occur.

Recent research has revealed that the deviation from stoichiometry of the grown crystal imparts a very great effect upon the characteristics or the life of the devices formed with such crystals having a deviation of stoichiometry. The present inventor, in order to solve the above-mentioned problems in the technical field of epitaxial growth, earlier proposed in Japanese Patent Application No. Sho 57-118916 a method for supplying As vapor throughout the growth process, with successful results. However, in the field of growing a single crystal in the abovesaid earlier proposed method, there was not given a consideration to a growth apparatus which is constructed to avoid such deviation from stoichiometry of the grown crystal.

SUMMARY OF THE INVENTION

It is, therefore, the object of the present invention to provide a new apparatus for growing a GaAs single crystal having a minimized deviation from stoichiometry and having a good crystal habit by utilizing a floating zone, which eliminates the abovesaid drawbacks of the conventional apparatus for growing a GaAs single crystal.

BRIEF DESCRIPTION OF THE PRIOR ART

DETAILED DESCRIPTION OF THE PREFERRED EMBODIMENTS

The present invention will hereunder be described with respect to the preferred embodiments by referring to the accompanying drawings.

Figure 1:
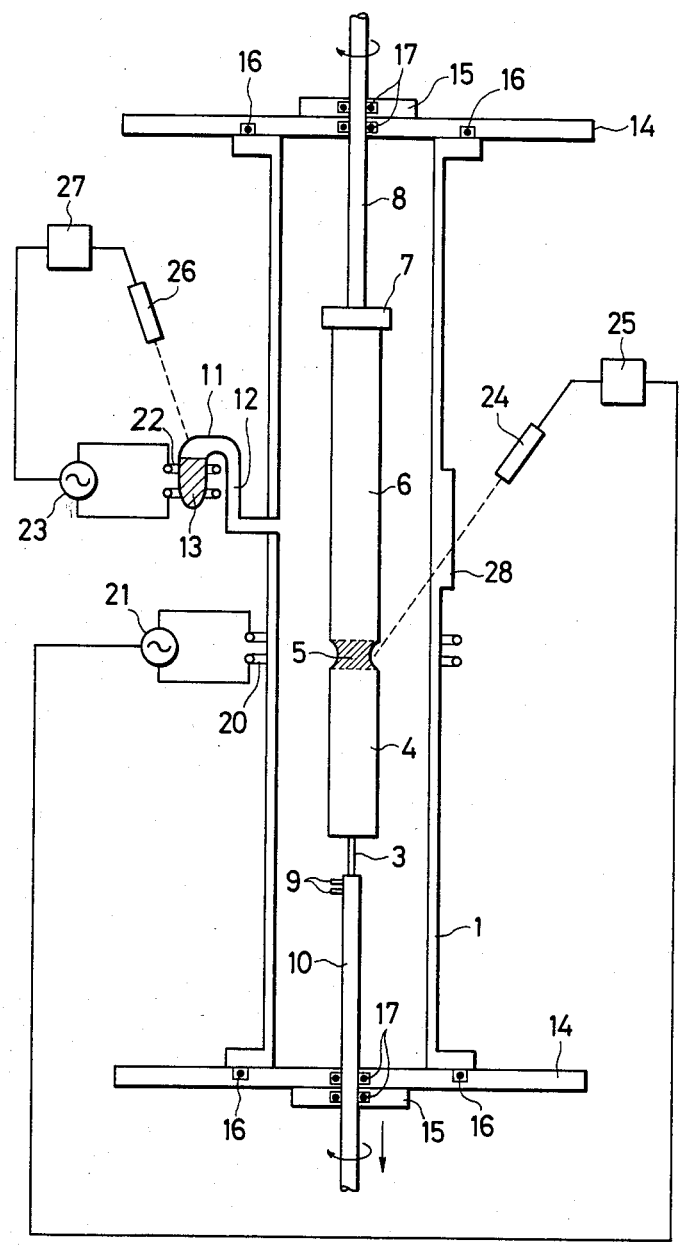
FIG. 1 is a schematic diagram of an embodiment of the apparatus structure for growing a GaAs single crystal by utilizing a floating zone, according to the present invention.

FIG. 1 shows an embodiment of the GaAs single crystal growing apparatus which relies on the floating zone method according to the present invention. Reference numeral 1 represents a quartz cylinder; 3 a GaAs seed crystal; 4 a GaAs single crystal rod; 5 a GaAs melt region; 6 a GaAs polycrystal rod; 8 a supporting rod for the GaAs polycrystal rod 6; 7 a chuck for establishing a connection of the GaAs polycrystal 6 with the supporting rod 8; 9 a connector for the GaAs seed crystal 3 and its supporting rod 10; 11 a quartz vessel for containing As; 12 a narrow quartz tube for connecting the As vessel 11 with the quartz cylinder 1 of the apparatus for communication therebetween; 13 an As element of a high purity; 14 and 15 stainless plates for sealingly supporting an open end of the quartz cylinder 1, respectively; 16 and 17 sealing members made of, for example, O-rings or gaskets, respectively; 20 a working coil serving as a radio frequency (hereinafter to be referred to as RF) induction heater for heating the GaAs polycrystal 6 to form its melt 5; 21 a power supply using, for example, RF oscillator; 22 a working coil serving as an RF induction heater to heat As 13; 23 a power supply of a high frequency such as, similar to 21, an RF oscillator; 24 a thermometer such as a pyrometer for measuring the temperature of the melt region 5; 26 a thermometer such as a pyrometer for controlling the vapor pressure of As 13; 25 and 27 temperature controllers for controlling the RF power supplies 21 and 23, respectively; and 28 a window for observing the temperature.

As stated above, the crystal growth according to the present invention is performed by relying on the floating zone method. To begin with, the polycrystal located at the bottom end of the polycrystal rod 6 is heated by the induction heater to the melting point of GaAs or somewhat higher than that to about 1240° C. to render it to a melted state which will hereunder be referred to as a melted portion to which is connected the seed crystal 3. After an appropriate necking is established therebetween, the supporting rods 10 and 8 are rotated while gently moving these supporting rods 10 and 8 downwardly, and as a result a single crystal 4 is grown. One of the features of the present invention is, in the crystal growth method using said floating zone technique, an As container for supplying As vapor is connected to the quartz cylinder 1 which is a closed type container, to supply As vapor into the sealed space wherein the polycrystal and the single crystal are charged. Using the seed crystal 3 as the seed for the growth, the temperature of As in the As vessel is set in such a way that an optimum vapor pressure $P_{opt}$ of As is applied to the melt region 5 throughout the growth process of crystal. The optimum As vapor pressure is provided at a value of $P_{opt} \approx 2.6 \times 10^6 \exp(-1.05 \text{ eV}/kT)$ (Torr). The temperature of the As region, $T_{As}$, may be regarded as $\sqrt{T_{As}/T_{GaAs}} = P_{As}/P_{GaAs}$ if the diameter of the pipe 12 for connecting the As vessel with the quartz cylinder 1 is small. Here, $P_{As}$ represents the vapor pressure produced by the As 13 in the As region 11; $T_{GaAs}$ represents the temperature of the melted region; and $P_{GaAs}$ represents the vapor pressure of As at the melted region, and this vapor pressure may be considered as being a value close to $P_{opt}$ in order to control the vaporization of As from the melted region of the GaAs crystal. Accordingly, if $T_{GaAs}$ is assumed to be 1240° C. and $P_{GaAs}$ as 820 Torr, $T_{As}$ and $P_{As}$ may be set so as to establish the formula: $\sqrt{T_{As}/P_{As}} = \sqrt{T_{GaAs}/P_{GaAs}} = 0.00474$.

Since $P_{As}$ is determined by the value of $T_{As}$, it is only necessary to determine the temperature $T_{As}$. In order to secure a desirable stoichiometry of the GaAs single crystal, the temperature of As region has to be controlled with precision, i.e. it is necessary to hold the stability of the temperature to fall within the range of temperature fluctuation less than $\pm 0.1°$ C.

The second feature of the present invention is to establish a continuous temperature gradient in the region between the As vessel and the GaAs melt region 5 in order to insure that the abovesaid As vapor supply is carried out under the perfectly controlled state. Especially, the temperature gradient in the vicinity of the boundary between the melted region 5 and the polycrystal region 6, or between the melted region 5 and the single crystal region 4, has to be made gentle in order to inhibit the development of lattice dislocations. In order to materialize this continuous temperature distribution, there may be employed not only the RF heating as mentioned in the embodiment, but also such a heating technique as resistance heating, a lamp or a laser. Furthermore, the temperature of the region leading from the As vessel to the melted region 5 ought to be held always higher than the temperature of As 13 to prevent As vapor from depositing, in the form of solids, onto the wall of the quartz cylinder 1.

In order to effect a growth of a GaAs single crystal having a good crystal perfection, sufficient care has to be taken with respect to the precise controlling of the As vapor pressure which is applied, especially to a precise temperature controlling of the GaAs crystal rod centering around the melted region, and also to the speed of rotation as well as the speed of movement of the crystal rods. The measurement of the temperatures may be made not only through the window, but also by providing quartz fibers at the As region and the boundary region between the melt region and the single crystal so as to measure the temperature thereby.

The controlling of the diameter of the grown crystal may be made by observing, through the window 28, the conditions of the melted region 5 of the crystal rod and of the single crystal 4. It is needless to say that this controlling of the diameter of the crystal to be grown may be made in an automatic fashion by the use of an appropriate automatic controlling system.

As will be understood from the above-mentioned value of $P_{opt}$, the vapor pressure of As in the As region 11 for the purpose of obtaining a GaAs single crystal having a satisfactory stoichiometric composition is almost close to 1 atm of atmospheric pressure. Accordingly, it is not so difficult technically to establish a sealed state of the quartz cylinder 1 in the growth apparatus shown in the above-described embodiment. It will be needless to say that the apparatus may have such an arrangement that this growth apparatus as a whole is enclosed in a pressure-resistant outer cylinder in order to prevent any leak of the As vapor from the quartz cylinder 1 to the outside thereof. In such case, there may be employed such as inert gas as nitrogen, argon and helium for the purpose of establishing an applicable pressure, or to use a mixed gas consisting of such inert gas and As vapor for the same purpose. Furthermore, though not shown in FIG. 1, it will be needless to say that there may be provided a mechanism for cooling any particular region where a rise in the temperature is not desirable.

Figure 2:
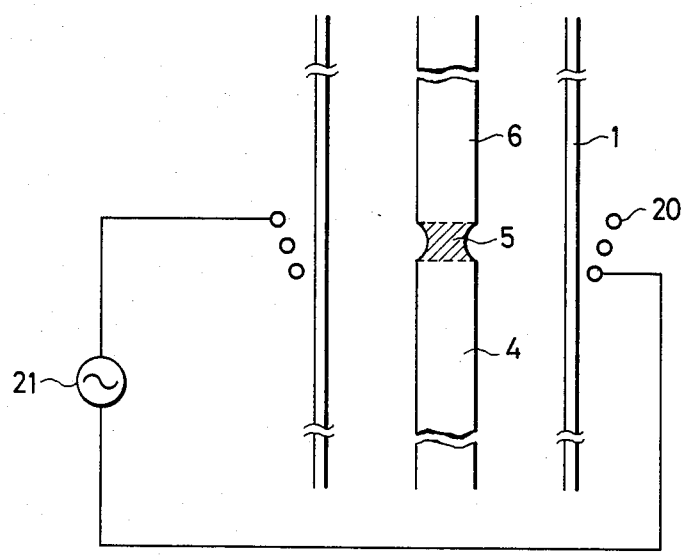
FIG. 2 is a schematic diagram showing an example of a working coil used in the apparatus of FIG. 1 for performing an induction heating to locally melt a GaAs rod, wherein the coil has different diameters in its upper part relative to the lower part.
Figure 3:
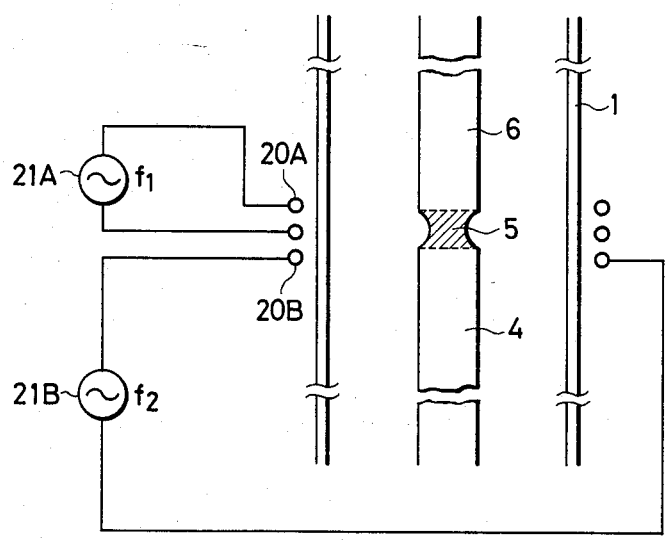
FIG. 3 is a schematic diagram showing another example of working coil used in the apparatus of FIG. 1 for performing an induction heating to locally melt a GaAs rod, wherein two coils are provided so that the radio frequency of the electric power supplied to these coils are varied.

FIGS. 2 and 3 are further embodiments of the present invention, showing modified structures in the vicinity of the melted region of the GaAs crystal. These embodiments also employ the floating zone technique of the present invention as in the case of the preceding embodiment. However, these latter embodiments are invariably intended to obtain a GaAs single crystal of a large diameter. In the embodiment of FIG. 2, the diameter of the upper turns of the working coil 20 intended to produce a melted region 5 is designed larger than that of its lower turns. By winding the working coil in the "upper flared type" as shown, there will be developed a floating power buoyancy in the material charged in the melting region due to the interaction between the magnetic field produced by the current flowing through the coil and the induction current flowing through the material, so that a single crystal having a large diameter is obtained.

FIG. 3 shows an arrangement that there are provided two working coils 20A and 20B intended to melt the material GaAs polycrystal. The coil 20B is provided below the coil 20A. The frequency $f_2$ of the power supply 21B for the lower coil 20B is set lower than the frequency $f_1$ of the power supply 21A for the upper coil 20A. By this arrangement, it is possible to develop a floating force as in the case of FIG. 2. Thus, there is obtained a single crystal having a large diameter.

Figure 4:
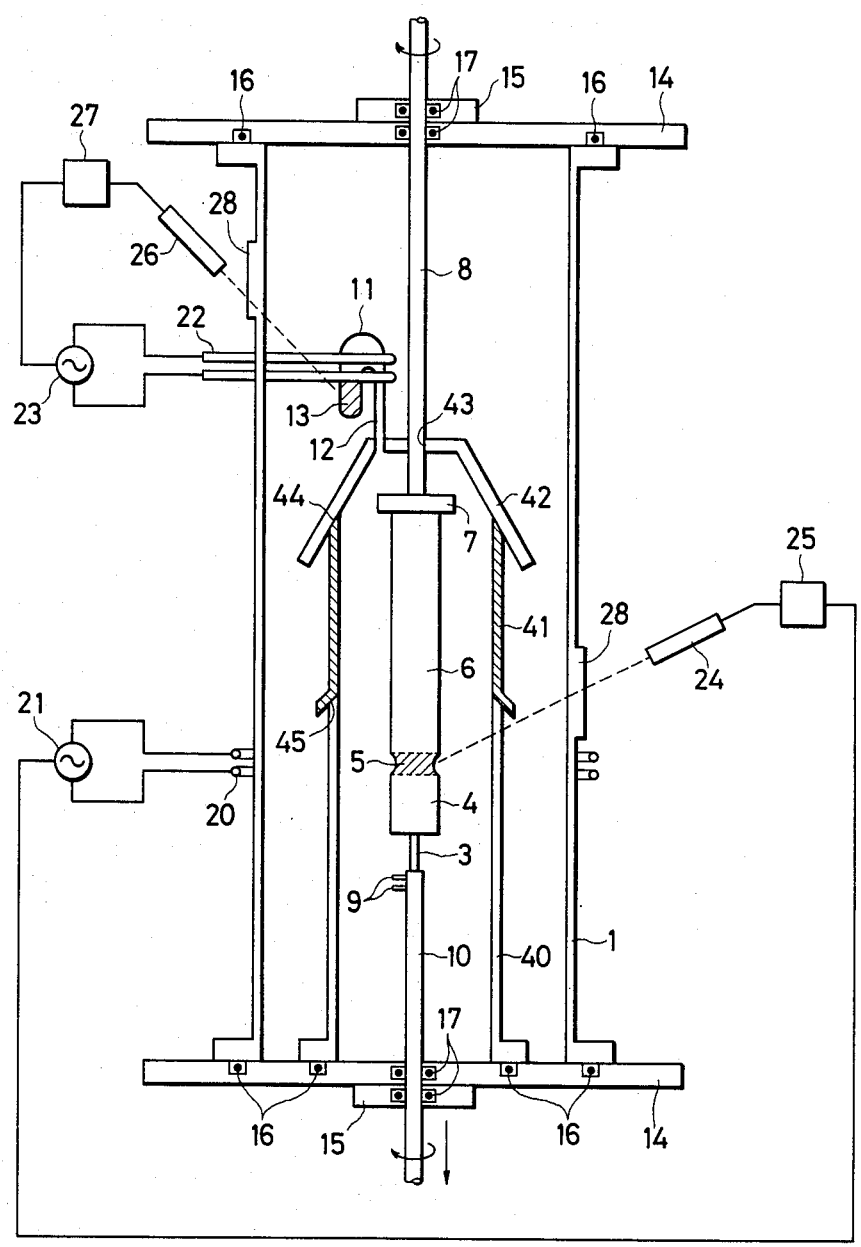
FIG. 4 is a schematic diagram of another embodiment of the apparatus structure for growing a GaAs crystal by utilizing a floating zone, according to the present invention.

FIG. 4 shows still another embodiment of the apparatus of the present invention. In this embodiment, in order to improve the temperature distribution in the region leading from the position where there is provided a melt region 5 to the As vessel, the closed container accomodating a GaAs rod is constructed with a carbon cylinder 41, a quartz cylinder 40 and a cap 42 provided with an As vessel. The quartz cylinder 40 and the cap 42 may be replaced by sapphire cylinder and cap as required. Reference numerals 43, 44 and 45 represent ground-and-fit adjoining portions, respectively. Other parts are similar to those shown in FIG. 1, so that their description is omitted. In order to avoid the development that the supplied As becomes a solid and is deposited on the walls of the container, the temperature of the region leading from the As vessel and the melt region 5 is held higher than that of the As vessel with a continuous gradient therebetween. By using a carbon container 41 having a high thermal conductivity, the abovesaid improvement of temperature distribution is made feasible. It is necessary, however, to give attention so that, in order to avoid the mingling of the gas flowing out of the carbon material of the container into the crystal as an impurity, the carbon material has to be selected from a highly pure carbon and to be sufficiently deprived of its outgoing gas by baking it in a vacuum.

As described above, the apparatus according to the present invention for growing a GaAs single crystal is designed so that, in the floating zone technique, an optimum As vapor pressure is applied to the melted portion of the GaAs rod so as to satisfy the stoichiometric composition of the grown crystal. Thus, as compared with the conventional horizontal Bridgman method or liquid encapsulation Czochralski (LEC) method, the apparatus of the present invention features a greatly reduced mingling of undesirable impurities into the grown crystal. Moreover, the crystal which is grown has very few lattice dislocations, and it is possible to obtain a perfect GaAs single crystal of a large diameter having a high degree of purity. Thus, the apparatus of the present invention can give a great contribution industrially since it is possible to obtain an extremely superior single semiconductor crystal to be used as a substrate for various kinds of microwave devices such as high-speed transistors and high-speed semiconductor integrated circuits.

What is claimed is:

1. An apparatus for growing GaAs single crystals using a floating zone method, said apparatus comprising:

a closed cylinder charged with a GaAs polycrystal and an adjacently located GaAs single seed crystal, an As vessel charged with As and communicating, via a narrow passage, with said closed cylinder for supplying As vapor into said closed cylinder, first heating means for heating said GaAs polycrystal and establishing a GaAs melted portion, first means for measuring the temperature of the GaAs melted portion, first temperature controller connected to said first temperature measuring means and said first heating means for having said GaAs melted portion at a temperature set at or just above the melting point of GaAs, second heating means for holding said As vessel at a substantially constant temperature sufficient to impart to a GaAs single crystal being grown an optimum As vapor pressure to cause said GaAs single crystal being grown to be at least substantially devoid of deviation from the stoichiometric composition, said second heating means providing sufficient heat to said As vessel and said narrow passage to prvent said As vapor from depositing on the inside of said closed cylinder, second means for measuring the temperature in said As vessel, second temperature controller connected to said second temperature measuring means and said second heating means for keeping said As vessel at a constant temperature, first rotating and vertically moving means for said GaAs polycrystal connected to a rod rotated by a chuck, second rotating and vertically moving means for said GaAs single seed crystal connected to a rod rotated by a chuck.

2. An apparatus according to claim 1, in which:

said GaAs polycrystal and said GaAs single crystal are housed in a housing made with at least one of the materials selected from the group consisting of quartz, carbon and sapphire, said housing having joints which are ground-and-fit so as to provide a hermetic sealing at said joints.

3. The apparatus according to claim 1, in which said first heating means is a radio frequency coil heater connected to a radio frequency power supply.

4. The apparatus according to claim 1, in which each of said heating means is a resistance heater connected to a power supply.

* * * * *